United States Patent
Burgess

(10) Patent No.: US 7,139,541 B2
(45) Date of Patent: Nov. 21, 2006

(54) RADIO TRANSMISSION DEVICE AND METHOD FOR ALIGNING PARAMETERS THEREOF

(75) Inventor: Paul Burgess, Bochum (DE)

(73) Assignee: Nokia Corporation, Espoo (FI)

( * ) Notice: Subject to any disclaimer, the term of this patent is extended or adjusted under 35 U.S.C. 154(b) by 213 days.

(21) Appl. No.: 10/451,163

(22) PCT Filed: Dec. 17, 2001

(86) PCT No.: PCT/EP01/14891

§ 371 (c)(1),
(2), (4) Date: Nov. 26, 2003

(87) PCT Pub. No.: WO02/51022

PCT Pub. Date: Jun. 27, 2002

(65) Prior Publication Data

US 2004/0077321 A1    Apr. 22, 2004

(30) Foreign Application Priority Data

Dec. 18, 2000    (EP) .................................. 00127720

(51) Int. Cl.
*H04B 1/06* (2006.01)
(52) U.S. Cl. ..................... 455/260; 455/76; 455/209; 455/313
(58) Field of Classification Search ................ 455/118, 455/126, 312, 130, 182.1, 73, 76, 78, 131, 455/205, 208, 209, 311, 313, 314, 255, 257, 455/258, 259, 260
See application file for complete search history.

(56) References Cited

U.S. PATENT DOCUMENTS

| | | | |
|---|---|---|---|
| 5,507,015 A | 4/1996 | Karczewski et al. | |
| 5,542,114 A * | 7/1996 | Kojima et al. | 455/196.1 |
| 5,802,463 A | 9/1998 | Zuckerman | |
| 6,137,999 A | 10/2000 | Lovelace et al. | |
| 6,519,448 B1 * | 2/2003 | Dress et al. | 455/41.2 |
| 6,650,875 B1 * | 11/2003 | Rozenblit et al. | 455/91 |
| 6,681,123 B1 * | 1/2004 | Leppa et al. | 455/561 |

* cited by examiner

*Primary Examiner*—Edward F. Urban
*Assistant Examiner*—Nhan T. Le
(74) *Attorney, Agent, or Firm*—Ware, Fressola, Van Der Sluys & Adolphson, LLP

(57) ABSTRACT

The application discloses a radio transmission device for receiving/transmitting of radio packets, comprising: a reception means (34) connected to a mixing means (4) via a transmit/receive switch (32) and an amplifying means (30), said mixing means (4) being connected via a demodulation means (12) to a base band processing means (20), wherein said base band processing means (20) is connected via a modulation means (28) to a power amplifying means (42), wherein said modulation means (28) is releasably connected via a phase locked loop circuit (15) to said mixing means (4).

25 Claims, 1 Drawing Sheet

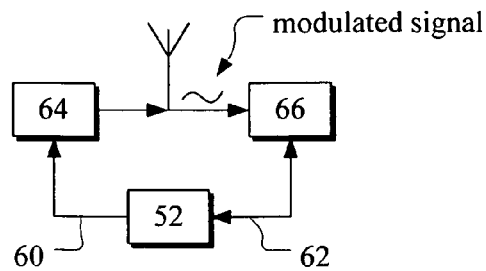
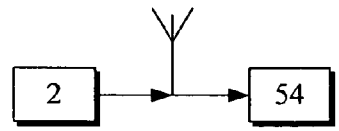
FIG. 1  FIG. 2
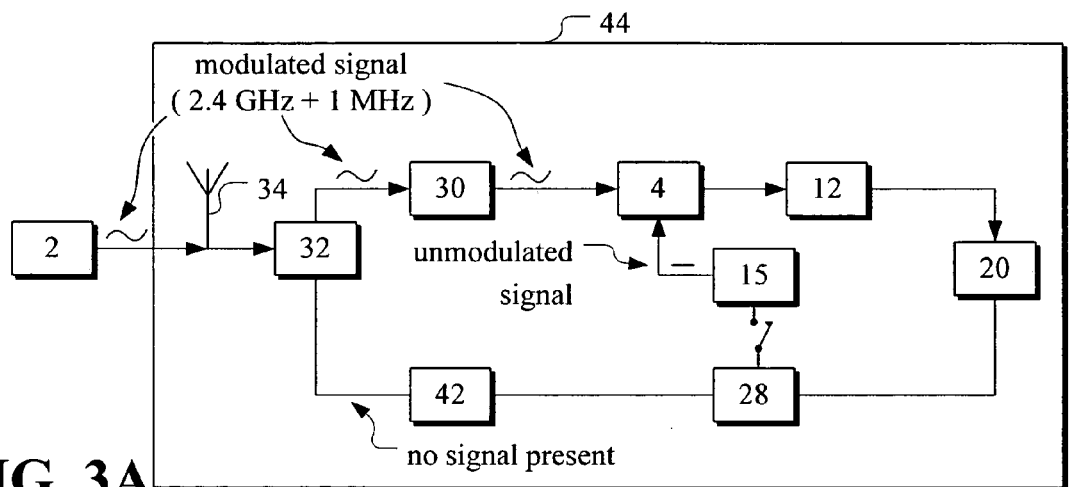
FIG. 3A
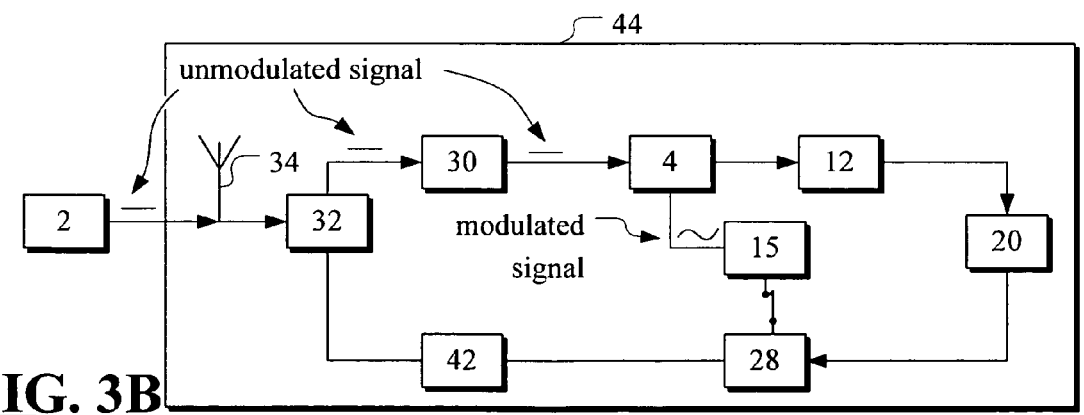
FIG. 3B
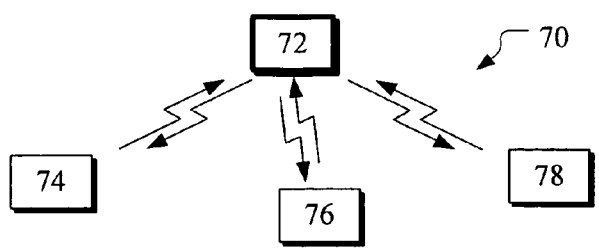
FIG. 4

RADIO TRANSMISSION DEVICE AND METHOD FOR ALIGNING PARAMETERS THEREOF

CROSS REFERENCE TO RELATED APPLICATIONS

This is the U.S. national stage of International Application PCT/EP01/14891 filed Dec. 17, 2001 published in English on Jun. 27, 2002 under International Publication No. WO 02/51022 A1 and from which priority is claimed to European application 00127720 filed Dec. 18, 2000.

BACKGROUND OF THE INVENTION

1. Technical Field

The present invention relates generally to radio transceivers using phase-locked loop circuits (PLLs). It also relates generally to superheterodyne radio transceivers. In particular the present invention relates to superheterodyne transceivers capable of executing an alignment process without using an external feedback loop.

2. Discussion of Related Art

The growing spread of cellular phones in recent years shows the demand for low cost transceivers. As for the phones, a wireless transmission system is planned to replace connection wires in other technical fields.

One conventional system to replace connection wires is the Bluetooth™ system. It is a low power, low range, and low cost radio communication system that is planned to replace wires or cables between computers, components, e.g. monitors and the like. The Bluetooth™ system operates at a frequency of 2.4 GHz. The frequency band is called ISM (Industrial Scientific and Medicine) and is destined for unlicensed low power radio operation up to a maximum irradiated power up to 100 mW, or 20 dbm. With an irradiated power up to 100 mW a spatial transmission range of a few centimeters up to a few hundred meters can be attained. Due to limitations in different countries, 23 to 79 channels having a bandwidth of 1 MHz are allocated for the unlicensed use. The Bluetooth™ system uses a frequency hopping algorithm to reduce interference caused by other users of the ISM band. The frequency hopping is executed at a rate of 1600 hops per second.

With such a short distance radio transmission all plug-in connection problems associated with e.g. laptop computers having periphery devices such as printers, storage means, or a network are easily solved, thereby obviating the need for a wire connection.

In most transceivers having variable frequency a phase locked loop (PLL) circuit is used to generate the channel frequency. The use of a PLL is a well known and cheap way to build a variable frequency generator having almost the frequency stability of a quartz oscillator.

A standard PLL comprises a voltage controlled oscillator (VCO), a frequency divider, a reference oscillator and a feed back loop. In the standard operation, the output oscillation from the VCO is divided by a frequency divider and the phases are compared with the phases of a reference oscillator in a phase detector. Any deviation of the phases of the divided VCO frequency and the reference oscillation is fed back to the VCO. With this feedback loop the output frequency of the PLL is locked to a multiple of the reference oscillator frequency. Frequency deviations of the reference oscillator due to manufacturing tolerances are multiplied by the division factor of the frequency divider. Therefore it is important to align the reference oscillator.

For low cost radio transceivers the frequency of the reference oscillator is usually adjusted during manufacture using a piece of measurement equipment such as a frequency counter. The frequency is measured while at the same time an internal parameter of the transceiver is varied until the measured frequency reaches the required value. The accuracy of the final frequency is therefore related to the time necessary for the adjustment process and the cost incurred by the final measurement equipment used. This method is used for Bluetooth™ modules during production.

Frequency shift keying (FSK) transceivers e.g. frequency modulation (FM) transceivers must have their modulation index of the transmitting path of the transceiver aligned. It is the usual routine to align the modulation index of an FSK transceiver such that the frequency deviation fulfils a given specification. For example, the specification requires that the maximum and minimum frequency deviations are not allowed to exceed predetermined limits. To achieve this accuracy the transmitter modulation index must be aligned by adjusting the transmitter of the device under test (DUT). The time taken for this alignment and the cost of the equipment required must be related to the accuracy of the final result. The alignment which is eventually adopted uses a spectrum analyzer to measure the output spectrum of the generated signal from the DUT transmitter. This result is employed to calculate the correct setting for the transmitter. The final setting is fed back to the DUT and a further measurement is made to confirm the setting.

The main drawback of the conventional alignment processes resides in the expensive test equipment and a time consuming alignment process. The alignment processes require complex algorithms and external feedback loops. Therefore, a transceiver module that can be sold to customers for integration into e.g. personal computers, has to provide additional external outputs and inputs. A conventional radio frequency transceiver module in addition needs a base band memory capacity.

From the WO 00/18072 there are already known receivers and transmitters for receiving or transmitting a radio packet at a predetermined frequency. A transceiver according to this document permits a power saving operation. It is not capable though of executing fast and simple alignment processes for the operation parameters, such as the reference oscillator frequency or the transmit modulation index.

DISCLOSURE OF INVENTION

The object underlying the invention is to provide a method and an apparatus capable of executing a fast and simple alignment process, without using any external feedback loops.

A further object of the invention is to increase the capacity of the manufacturing process by simplifying the alignment process leading to shorter cycle times.

A further object of the invention is to enable a customer to integrate a radio module in an application, even under job lot production conditions, without the need for expensive test equipment.

According to one aspect of the invention, a radio transmission device for receiving/transmitting of radio packets, comprises a reception means connected to a mixing means via an amplifying means. It also comprises a mixing means being connected via a demodulation means to a base band processing means, wherein said base band processing means is connected to a modulation means. The radio transmission device is characterised in that said modulation means is releasably connected via a phase locked loop circuit to said mixing means.

By using such a radio transmission device a modulation index alignment can be performed. The alignment process can be executed by using a calibrated reference frequency generator emitting a fixed continuous wave signal and a fixed modulated continuous wave signal. The reception means can be an antenna or a high frequency plug.

Preferably, said radio transmission device further comprises a power amplifying means connected to said modulation means. The power amplifying means can be used to generate a signal that can be transmitted via an antenna or high frequency cable.

Advantageously the radio transmission device further comprises a transmit/receive switch connected between said reception means and said amplifying means, wherein said amplifying means is connected to said transmit/receive switch. The transmit/receive switch can be used to use a single antenna for receiving and transmitting with the radio transmission device.

Preferably the base band processing means comprises analog/digital converting means. By using analog/digital converting means, detected demodulated signals are simpler to be saved and to be compared.

Conveniently the radio transmission device comprises an auxiliary amplifying means operationally inserted between the demodulation means and the base band processing means. By inserting an auxiliary amplifying means between the demodulation means and the base band processing means, the sensitivity of the detection is increased.

Advantageously the transmitter further comprises a pre-calibrated reference oscillator. By having a pre-calibrated reference oscillator, the radio transmission device is capable of re-aligning its reference oscillator and its modulation index at any time. This is interesting e.g. for radio transmission devices using more than one reference oscillator.

According to another aspect of the invention, the problem is solved by a radio network having radio transmission devices according to the invention.

According to another embodiment of the invention there is provided a method for aligning the transmission modulation parameter in a radio transmission device by supplying a fixed continuous wave signal to said radio transmission device.

The alignment method comprises the following steps of:
Supplying a fixed modulated continuous wave signal to said radio transmission device;
Amplifying said fixed modulated continuous wave signal;
Mixing said fixed modulated continuous wave signal with a local oscillator signal, and obtaining a first mixed signal;
Demodulating said first mixed signal;
Saving said first demodulated signal;
Applying a fixed unmodulated continuous wave signal;
Amplifying said fixed unmodulated continuous wave signal;
Modulating said local oscillator signal;
Mixing said fixed unmodulated continuous wave signal with said modulated local oscillator signal and obtaining a second mixed signal;
Demodulating said second mixed signal;
Recalling said first demodulated mixed signal;
Comparing said first demodulated mixed signal with said second demodulated mixed signal,
Varying a modulation parameter of said step of modulating said local oscillator signal until said second demodulated mixed signal substantially equals said first demodulated mixed signal.

By amplifying said fixed continuous wave or modulated continuous wave signal, the input amplitude of the mixing device can be controlled. By mixing and demodulating the modulated continuous wave signal, the base band processing means detects a first signal. This first signal is related to the modulated continuous wave signal of an external calibrated reference frequency generator and to the transmission function of the receiving path. This signal is saved in the base band processing means. By recalling the saved signal and modulating said recalled signal in the transmitting path of the radio transmission device, a signal related to the modulation index of the modulation means is generated. By mixing the continuous wave signal with the modulated signal, a modulated intermediate frequency signal is generated, which is also related to the transmit modulation index. Demodulating of this intermediate frequency signal generates a signal which is related to the transmit modulation index and to the transmission function of the receiving path. By comparing the fed back signals with the stored signal the transmission function of the receiving path can be compensated. The modulation index can be varied until both signals are equal. With indistinguishable or noisy signals, the modulation index is aligned and the alignment process can be terminated.

By supplying a fixed continuous wave signal instead of a complex test equipment, the alignment time and the financial expenditure can be decreased significantly. A customer using this fast and simple alignment process is capable of executing an alignment process without specific radio frequency experience. The fixed continuous wave signal can be a sinusoidal signal.

Conveniently the alignment process further comprises the step of digitising demodulated signals. By digitising the demodulated signals, the signals can be stored, be compared and be processed.

Advantageously the signals are amplified between the demodulating and detecting of the signal. By amplifying the signals in between the sensibility of the detection is increased.

Further advantages, advantageous embodiments and additional applications of the invention are provided in the following description of a preferred embodiment of the invention in connection with the enclosed figures.

BRIEF DESCRIPTION OF THE DRAWING

FIG. 1 is a block diagram of a conventional modulation index alignment process.

FIG. 2 is a block diagram of an alignment process according to the invention.

FIG. 3A is a block diagram of a radio transmission device in a first step of a modulation index alignment process.

FIG. 3B is a block diagram the radio transmission device of FIG. 3A in a second step of a modulation index alignment process.

FIG. 4 is a block diagram of a radio transmission device network according to the invention.

BEST MODE FOR CARRYING OUT THE INVENTION

While the following description is in the context of wireless communication systems involving portable or mobile radio telephones and/or computer communication systems, it will be understood by those skilled in the art that the present invention may be applied to other receiver concepts as well.

FIG. 1 is a block diagram of a conventional transmitter modulation index alignment. The alignment which is conventionally performed uses a spectrum analyzer 66 to analyze the output spectrum of a signal generated by a DUT (device under test) 64 transmitter. The DUT 64 is connected to the spectrum analyzer 66 via a radio frequency connection. The detected values are transferred via bus 62 to a control unit 52. The control unit 52 uses the received data to calculate the correct setting of the transmitter. The final setting is fed back to the DUT via a control bus 60. A further measurement is made to confirm the setting. The spectrum analyzer 66 must be tuned to the correct detection mode such that the measurement can be performed. This is usually controlled by an external control unit 52.

FIG. 2 is a block diagram of an alignment process according to the invention. A calibrated reference frequency generator 2 is connected to the DUT 54. The calibrated reference frequency generator 2 transmits a continuous wave (CW) signal to the DUT 54. The continuous wave signal is in a first step a modulated (CW) signal followed by an unmodulated CW signal. There is no external feedback loop necessary.

FIG. 3A is a block diagram of a radio transmission device 44 for the execution of a fast and simple transmit modulation index alignment process. In the figure the thin lines and the bold arrows between the single elements represent connections between the elements of the radio transmission device. The bold arrows are used to indicate signals present on said connections and the direction of the signals. The radio transmission device 44 is depicted in the first stage of a fast and simple transmit modulation index alignment process. The radio transmission device comprises a receiving part having a reception means 34, a transmit/receive-(TX/RX-) switch 32, an amplifying means 30, a mixing means 4 is usually connected to a phase locked loop circuit 15, a demodulation means 12 and a base band processing means 20. The demodulation means 12 has the ability to determine the amplitude and the frequency of the incoming signal. The radio transmission device 44 also comprises a transmitting part comprising said base band signal processing means 20, a modulation means 28 connected via a power amplifying means 42 and the TX/RX-switch 32 to the reception means 34.

In the first stage of the alignment process, the TX/RX-switch 32 is switched to the RX position, wherein both the power amplifying means 42 and the modulation means 28 are inactive during this first step of the fast and simple modulation index alignment. At the reception means 34 a modulated continuous wave signal is received from an external calibrated reference frequency generator 2. This signal can be for example a 2.4 GHz signal modulated with a 1 MHz signal. The signal is fed via the amplifying means 30 to the mixing means 4. At the mixing means 4 the modulated signal is mixed with an unmodulated signal from the phase locked loop circuit 15. The mixed signal is demodulated by the demodulation means 12. The demodulated mixed signal is detected and saved by the base band processing means 20.

FIG. 3B is a block diagram of a radio transmission device 44 of FIG. 3A during the second stage of the fast and simple transmit modulation index alignment process. As in FIG. 3A the thin lines and the bold arrows between the single elements represent connections between the elements of the radio transmission device. The bold arrows are used to indicate signals present on said connections and the direction of the signals.

As in FIG. 3B the TX/RX-switch 32 is switched to the RX position and the power amplifying means 42 is inactive during the second stage of the fast and simple modulation index alignment. At the reception means 34 an unmodulated continuous wave signal is received from an external calibrated reference frequency generator 2. The signal is fed via the amplifying means 30 to the mixing means 4. In the second stage of the alignment process, the internal phase locked loop circuit 15 signal is modulated by the modulation means 28, under the control of the base band processing means 20. In the second stage there is a signal transferred from the local oscillator 15 to the mixing means 4. Said modulated local oscillator 15 signal is fed to the mixing means 4. As a result of the two input signals a mixed signal is generated and fed to the demodulation means 12. The demodulated mixed signal is detected by the base band processing means 20, and is compared to the signal saved during the first stage of the alignment process. The modulation index of the transmitter can therefore be measured by the base band processing means 20 and be adjusted until the demodulated mixed signal is substantially similar to the previously saved signal.

One advantage of the proposed solution over conventional alignment processes is, that no expensive test equipment is required since a simple signal source can be used. This is very attractive to customers with little experience in radio frequency equipment such as computer or camera manufacturers. Other advantages are that the alignment time is much quicker since no measurement is performed by external test equipment and the alignment is much simpler to be implemented by the application projects since no external feedback loop is required to feed the measurement result back to the radio transmission device. Lastly, no base band memory is required and therefore a RF-only solution without memory storage can be sold to external customers.

FIG. 4 illustrates a radio network 70 of radio transmission device units according to the invention, including a master radio transmission device 72 and slave radio transmission devices 74, 76 and 78 communicating by transmitting and receiving radio packets. The master radio transmission device 72 initiates the connection of a slave to the network. The network operates in a time division duplex fashion. The radio transmission device units are synchronised to a common time frame determined by the master radio transmission device 72. To prevent interference the time division duplex transmission is combined with a frequency hopping algorithm. The radio transmission device units are synchronised to the frequency hopping algorithm by the master radio transmission device 72. The master radio transmission device 72 is capable of performing point-to-point or point-to-multi-point communication. The slave radio transmission devices 74, 76, 78 are only capable of replying to an order from the master radio transmission device 74. In this network 70 the master radio transmission device 72 is capable of dispatching an order to the slave radio transmission devices 74, 76, 78 to execute a fast and simple realignment process to realign their modulation indices. This is executed by the master radio transmission device 72 emitting a realignment command followed by continuous reference signals. The slave radio transmission devices 74, 76, 78 execute the alignment process as described in the FIGS. 2 to 3B. The network 70 operates at a frequency of 2.4 GHz, uses a frequency hopping algorithm, a time slot based transfer protocol and therefore allows real time voice and data communications. Such a radio network 70 can be used to realign every single radio transmission device in a network. With radio transmission devices with an own power supply a remote alignment process can be executed. The alignment process may be executed without a visible connection between the calibrated reference frequency generator and the transmitter.

While particular embodiments of the present invention have been described and illustrated, it should be understood that the invention is limited only by the attached claims. Since modifications may be made by persons skilled in the art, like adding filters to the radio device, the present application contemplates any and all modifications that fall within the spirit and scope of the invention disclosed and claimed herein.

The invention claimed is:

1. Method comprising:
    supplying a fixed modulated continuous wave signal to a radio transmission device;
    amplifying said fixed modulated continuous wave signal;
    mixing said fixed modulated continuous wave signal with a local oscillator signal, and obtaining a first mixed signal;
    demodulating said first mixed signal;
    saving said first demodulated signal;
    applying a fixed unmodulated continuous wave signal;
    amplifying said fixed unmodulated continuous wave signal;
    modulating said local oscillator signal;
    mixing said fixed unmodulated continuous wave signal with said modulated local oscillator signal and obtaining a second mixed signal;
    demodulating said second mixed signal;
    recalling said first demodulated mixed signal;
    comparing said first demodulated mixed signal with said second demodulated mixed signal,
    varying a modulation parameter during modulating said local oscillator signal until said second demodulated mixed signal substantially equals said first demodulated mixed signal.

2. Method according to claim 1, further comprising:
    digitizing said demodulated signals, and
    digitizing said demodulated mixed signals.

3. Method according to claim 1, further comprising:
    amplifying the signals between demodulating and detecting the signals.

4. Method according to claim 3, further comprising:
    digitizing said demodulated signals, and
    digitizing said demodulated mixed signals.

5. Apparatus comprising:
    a receiver connected to a mixer via an amplifier;
    said mixer being connected via a demodulator to a base band processor, wherein said base band processor is connected to a modulator; and
    said modulator is releasably connected via a phase locked loop circuit to said mixer; wherein said base band processor is responsive to a first demodulated mixed signal modulated in a first stage of a transmit modulation index alignment process for detecting and saving said first demodulated mixed signal, and
    wherein said base band processor is responsive to a second demodulated mixed signal modulated in a second stage of said alignment process for comparing said second demodulated mixed signal to said first demodulated mixed signal for adjusting said modulation index until the second demodulated mixed signal is substantially similar to said first demodulated mixed signal.

6. Apparatus according to claim 5, wherein said modulator is connected to a power amplifier.

7. Apparatus according to claim 6, further comprising a transmit/receive switch connected between said receiver and said amplifier, wherein said amplifier is connected to said transmit/receive switch.

8. Apparatus according to claim 5, wherein the base band processor comprises an analog/digital converter.

9. Apparatus according to claim 5, further comprising an auxiliary amplifier operationally inserted between the demodulator and the base band processor.

10. Apparatus according to claim 5, further comprising a pre-calibrated reference oscillator.

11. A radio network comprising a plurality of apparatuses as claimed in claim 5.

12. The apparatus of claim 5, wherein said modulator is connected to said mixer via said phase locked loop during said second stage for modulating an unmodulated continuous wave carrier signal via said phase locked loop.

13. Apparatus according to claim 5, wherein said modulator is not connected to said mixer via said phase locked loop during said first state.

14. Apparatus comprising:
    a receiver connected to a mixer via an amplifier;
    said mixer being connected via a demodulator to a base band processor, wherein said base band processor is connected to a modulator; and
    said modulator is releasably connected via a phase locked loop circuit to said mixer; wherein said receiver is responsive to a modulated continuous wave signal during a first stage of a transmit modulation index alignment process for aligning a device under test,
    wherein said receiver is responsive to an unmodulated continuous wave signal during a second stage of said alignment process, and
    wherein said modulator is for modulating said unmodulated continuous wave signal during said second stage via said phase locked loop.

15. Apparatus according to claim 14, wherein said modulated continuous wave signal received during said first stage is for comparison with said unmodulated continuous wave signal modulated by said modulator for aligning said unmodulated continuous wave signal modulated by said modulator with said modulated continuous wave signal for adjusting said transmit modulation index.

16. Apparatus according to claim 14, wherein said modulator is connected to a power amplifier.

17. Apparatus according to claim 16, further comprising a transmit/receive switch connected between said receiver and said amplifier, wherein said amplifier is connected to said transmit/receive switch.

18. Apparatus according to claim 14, wherein the base band processor comprises an analog/digital converter.

19. Apparatus according to claim 14, further comprising an auxiliary amplifier operationally inserted between the demodulator and the base band processor.

20. Apparatus according to claim 14, further comprising a pre-calibrated reference oscillator.

21. A radio network comprising a plurality of apparatuses as claimed in claim 14.

22. Apparatus comprising:
    means for receiving a signal connected to means for mixing a modulated signal with an unmodulated signal to produce a mixed signal via means for amplifying said signal;
    said means for mixing a modulated signal with an unmodulated signal connected via means for demodulating said mixed signal to produce a demodulated mixed signal to means for detecting and saving said demodulated mixed signal, wherein said means for detecting and saving said demodulated mixed signal is connected to means for modulating said demodulated mixed signal; and said means for modulating said demodulated mixed signal is releasably connected via means for providing a modulated local oscillator signal to said means for mixing a modulated signal with an unmodulated signal;

wherein said means for detecting and saving said demodulated mixed signal is responsive to a first demodulated mixed signal modulated in a first stage of a transmit modulation index alignment process for detecting and saving said first demodulation mixed signal, and wherein said means for detecting and saving said demodulated mixed signal is responsive to a second demodulated mixed signal modulated in a second stage of said alignment process for comparing said second demodulated mixed signal to said first demodulated mixed signal for adjusting said modulation index until the second demodulated mixed signal is substantially similar to said first demodulation mixed signal.

23. Apparatus of claim 22, further comprising means for re-aligning said modulation index.

24. Apparatus comprising:

means for receiving a signal connected to means for mixing a modulated signal with an unmodulated signal to produce a mixed signal via means for amplifying said signal;

said means for mixing a modulated signal with an unmodulated signal connected via means for demodulating said mixed signal to produce a demodulated mixed signal to means for detecting and saving said demodulated mixed signal, wherein said means for detecting and saving said demodulated mixed signal is connected to means for modulating said demodulated mixed signal; and said means for modulating said demodulated mixed signal is releasably connected via means for providing a modulated local oscillator signal to said means for mixing a modulated signal with an unmodulated signal;

wherein said means for receiving a signal is responsive to a modulated continuous wave signal during a first stage of a transmit modulation index alignment process for aligning a device under test, wherein said means for receiving a signal is responsive to an unmodulated continuous wave signal during a second stage of said alignment process, and wherein said means for modulating said demodulated mixed signal is for modulating said unmodulated continuous wave signal during said second stage via said means for providing a modulated local oscillator signal.

25. Apparatus of claim 24, further comprising means for re-aligning said modulation index.

* * * * *